United States Patent
Elliott

(10) Patent No.: US 11,201,462 B2
(45) Date of Patent: Dec. 14, 2021

(54) FAULT-TOLERANT SOLID STATE POWER CONTROLLER

(71) Applicant: GE Aviation Systems Limited, Cheltenham (GB)

(72) Inventor: David Alan Elliott, Cheltenham (GB)

(*) Notice: Subject to any disclaimer, the term of this patent is extended or adjusted under 35 U.S.C. 154(b) by 508 days.

(21) Appl. No.: 15/864,272

(22) Filed: Jan. 8, 2018

(65) Prior Publication Data

US 2018/0205220 A1    Jul. 19, 2018

(30) Foreign Application Priority Data

Jan. 16, 2017 (GB) ..................................... 1700715

(51) Int. Cl.
| | | |
|---|---|---|
| *H02H 7/22* | (2006.01) | |
| *H02H 3/10* | (2006.01) | |
| *H03K 17/082* | (2006.01) | |
| *H02H 3/05* | (2006.01) | |
| *H03K 17/56* | (2006.01) | |

(52) U.S. Cl.
CPC .............. *H02H 7/222* (2013.01); *H02H 3/05* (2013.01); *H02H 3/10* (2013.01); *H03K 17/0822* (2013.01); *H03K 17/56* (2013.01)

(58) Field of Classification Search
CPC ............ H02H 3/05; H02H 3/10; H02H 7/222; H02H 3/08; H03K 17/08–0828
See application file for complete search history.

(56) References Cited

U.S. PATENT DOCUMENTS

| | | | |
|---|---|---|---|
| 4,717,996 A | 1/1988 | Bourke et al. | |
| 5,574,611 A | 11/1996 | Nishijima et al. | |
| 5,763,962 A * | 6/1998 | Tsurumi | H03K 17/691 |
| | | | 307/129 |
| 5,973,899 A | 10/1999 | Williams et al. | |
| 7,110,231 B1 | 9/2006 | De La Ree et al. | |
| 7,505,820 B2 | 3/2009 | Plivcic et al. | |
| 8,390,972 B2 | 3/2013 | Simper et al. | |
| 8,836,338 B2 | 9/2014 | Tyler et al. | |
| 2011/0013323 A1 | 1/2011 | Hyde et al. | |
| 2015/0138681 A1* | 5/2015 | Mayes | H02H 3/08 |
| | | | 361/93.7 |
| 2016/0254658 A1 | 9/2016 | Jacobson | |

FOREIGN PATENT DOCUMENTS

| | | |
|---|---|---|
| EP | 0 554 553 A2 | 8/1993 |
| WO | 2016/194649 A1 | 12/2016 |

OTHER PUBLICATIONS

Combined Search and Examination Report issued in connection with corresponding GB Application No. GB 1700715.4 dated Jul. 12, 2017.

* cited by examiner

*Primary Examiner* — Jared Fureman
*Assistant Examiner* — Christopher J Clark
(74) *Attorney, Agent, or Firm* — Wood IP LLC

(57) ABSTRACT

A solid state power controller for delivering power to a load is provided. The solid state power controller includes a set of sections, where each section includes at least one power switching block. The solid state power controller further includes protection circuitry in each section. The protection circuitry is configured to prevent a fault occurring in one power switching block to propagate to the other sections, to other power switching blocks, or to the load.

17 Claims, 4 Drawing Sheets

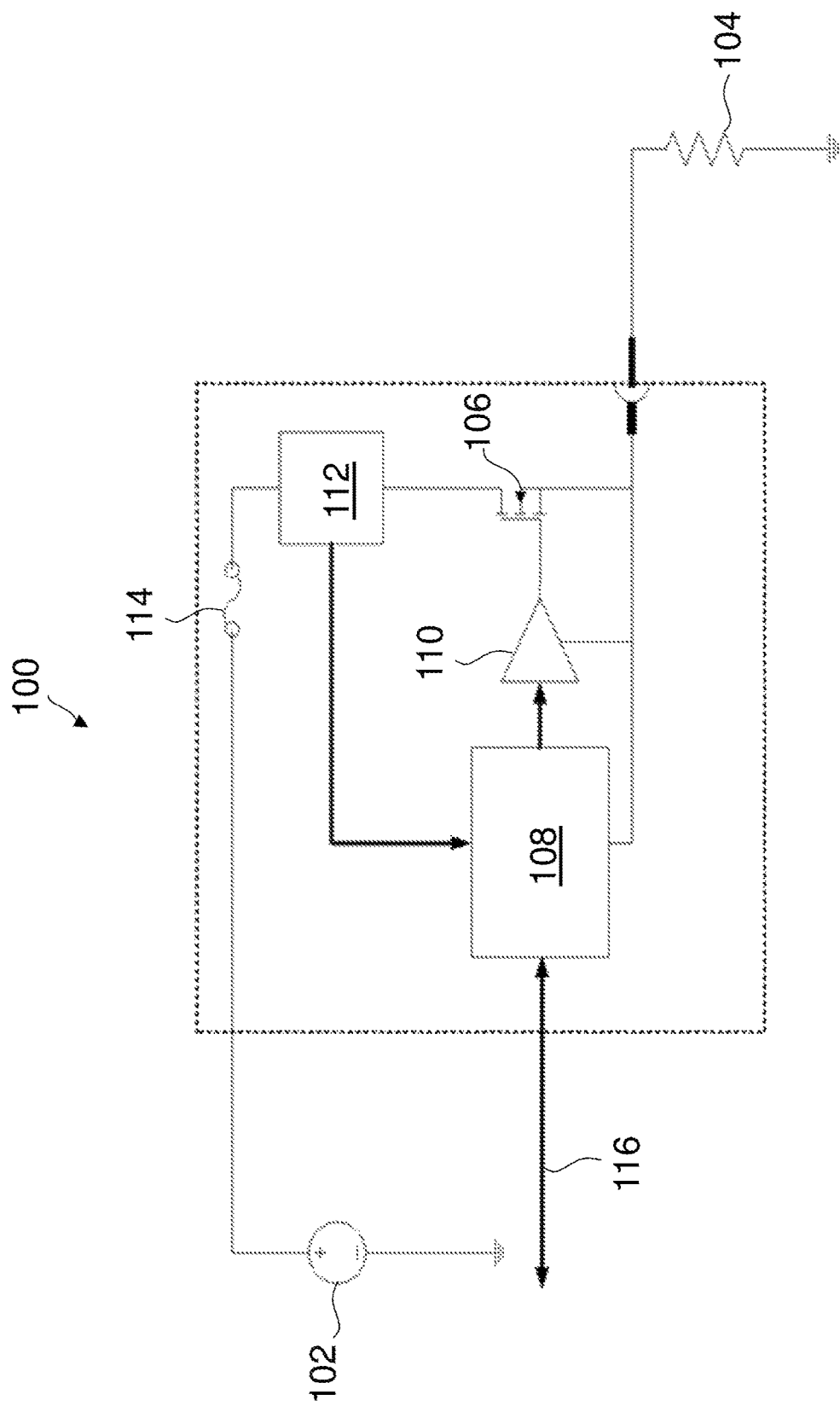
FIG. 1 (CONVENTIONAL)

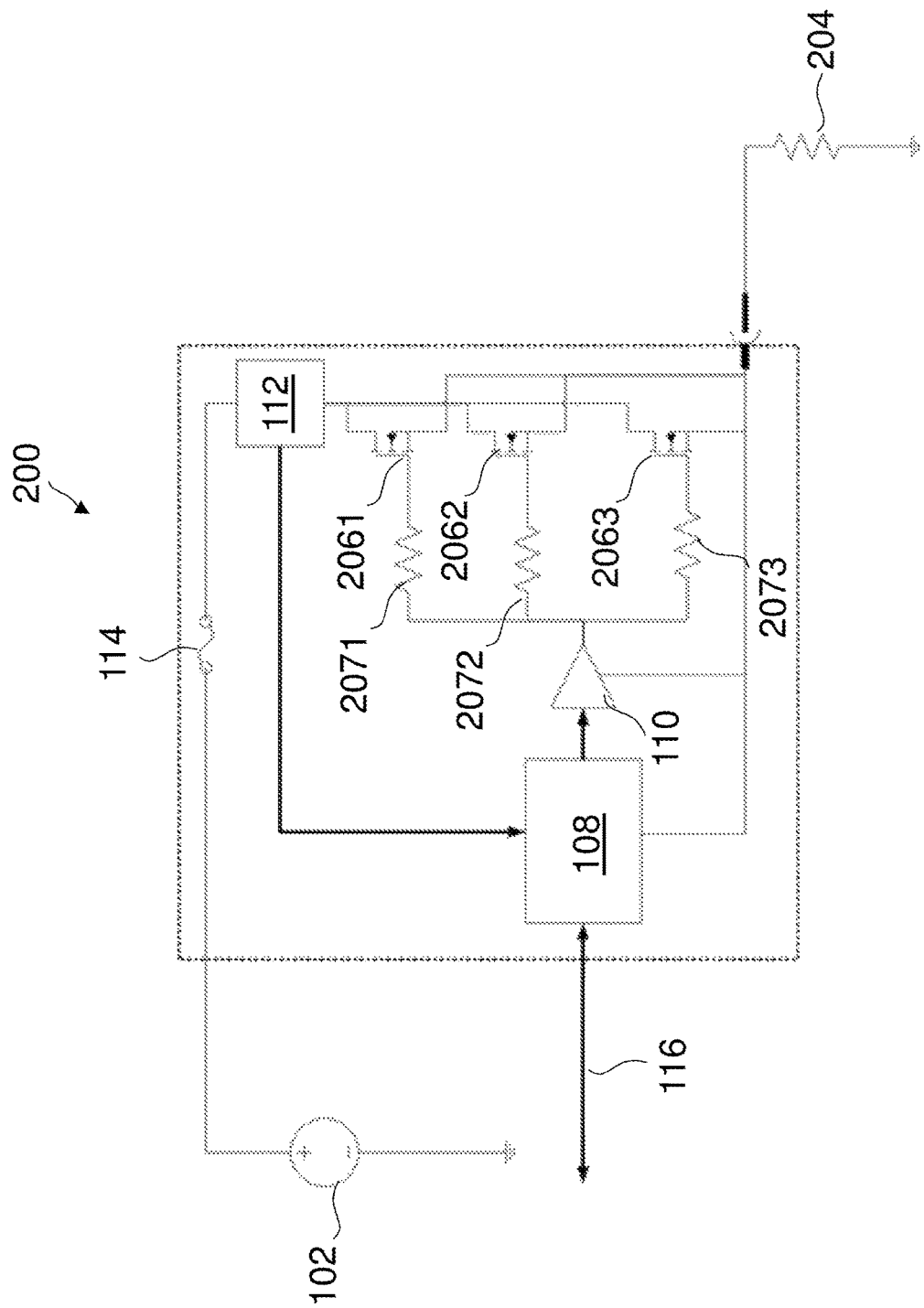
FIG. 2 (CONVENTIONAL)

FAULT-TOLERANT SOLID STATE POWER CONTROLLER

FIELD OF INVENTION

The present disclosure relates to solid state power controllers (SSPCs). More particularly, the present disclosure relates to fault-tolerant SSPCs.

BACKGROUND OF THE INVENTION

Electrical power distribution systems typically include one or more electrical power distribution units (EPDUs) that route power from one or more sources (e.g., generators and/or batteries) to load circuits. For example, typical EPDUs include high power routing components that can change their configuration dynamically, allowing EPDU components and load circuits to adapt to changing circumstances.

These EPDUs can also alter their configuration dynamically in order to prioritize power to the most essential loads when power demand exceeds the available supply. Moreover, the EPDUs protect against dangerous conditions such as excessive power flow due to faults in the loads or power distribution wiring that could otherwise result in serious situations, including electrical fires.

SSPCs have been developed to emulate the principal relay and circuit breakers function that typical EPDUs require, as well as for providing additional functionality, such as monitoring power flow for diagnostics purposes. Initially, limitations in semiconductor technology, particularly in semiconductor power switching devices, restricted SSPCs to lower voltages (e.g., 28 V DC or 115 V AC) at current levels of up to about 30 A.

Higher current SSPCs required to emulate contactors needed for switching high currents can be constructed by parallelizing a large number of power switching components. However, the increase in component comes at the expense of reliability. Furthermore, some of the common failure modes of these components may cause damages to upstream and/or downstream devices and may even cause an electrical fire.

BRIEF DESCRIPTION OF THE INVENTION

Given the aforementioned deficiencies, there is a need to provide SSPC circuits including a large number of components and featuring a high degree of parallelization without compromising reliability and the ability to isolate faults. The examples featured herein help solve or mitigate these issues as well as other issues known in the art.

Typical SSPCs rated at sustained currents of up to about 50 A for use in many applications including aircraft power distribution have proven to offer many well-known benefits over the equivalent electro-mechanical alternatives such as circuit breakers and relays. However, such applications also require higher current power controllers to control and route power from the sources such as the aircraft generators.

The examples disclosed herein provide high current SSPCs that can automatically isolate a faulty power switching block, allowing the SSPCs to continue to provide their principal functionality, albeit with performance level reduced from the SSPCs maximum performance. Nevertheless, in typical applications, such as in aircraft flight, such reduction in performance may not prevent the aircraft to continue its mission.

Various aspects contain the failure of a component to the specific power switching block in which it occurs, without allowing the SSPC to lose its function. For example, when a failure occurs, components that have not failed are prevented from suffering excessive electrical stress, preserving their integrity. Other aspects isolate failed elements so that overall SSPC function is retained to the extent the SSPC can remain in use (for at least a short time) with minimal performance reduction. Furthermore, the advantageous aspects of the invention can be achieved with minimal complexity, and therefore minimal cost.

One exemplary aspect provides a solid state power controller for delivering power to a load. The solid state power controller includes a set of sections, where each section includes at least one power switching block. The solid state power controller further includes protection circuitry in each section. The protection circuitry is configured to prevent a fault occurring in one power switching block to propagate to the other sections, to other power switching blocks, or to the load.

Another exemplary aspect provides a solid state power controller for delivering power to a load. The solid state power controller includes set of power switching elements and first, second, and third protection circuits. The first protection circuit is configured to isolate a first fault occurring on a power line of a first set of power switching elements from reaching a second set of power switching elements. Further, the second protection circuit is configured to isolate a second fault occurring in the load from reaching the set of power switching elements. And the third protection circuit is configured to isolate a third fault occurring in a power switching element included in one set from reaching another set of power switching elements.

Another exemplary aspect provides a solid state power controller for delivering power to a load. The solid state power controller includes a power switching block including a set of power switching elements. The solid state power controller further includes protection circuitry configured to prevent of a fault occurring in a power switching element of the set of power switching elements to propagate to other power switching elements of the set of power switching elements.

Additional features, modes of operations, advantages, and other aspects of various examples are described below with reference to the accompanying drawings. It is noted that the present disclosure is not limited to the specific examples described herein. These examples are presented for illustrative purposes. Additional examples, or modifications of the examples disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are for purposes of illustrating the embodiments and are not to be construed as limiting the disclosure. Given the following enabling description of the drawings, the novel aspects of the present disclosure should become evident to a person of ordinary skill in the relevant art(s).

FIG. 1 illustrates a conventional SSPC.

FIG. 2 illustrates another example of a conventional SSPC.

DETAILED DESCRIPTION

Figure 3:
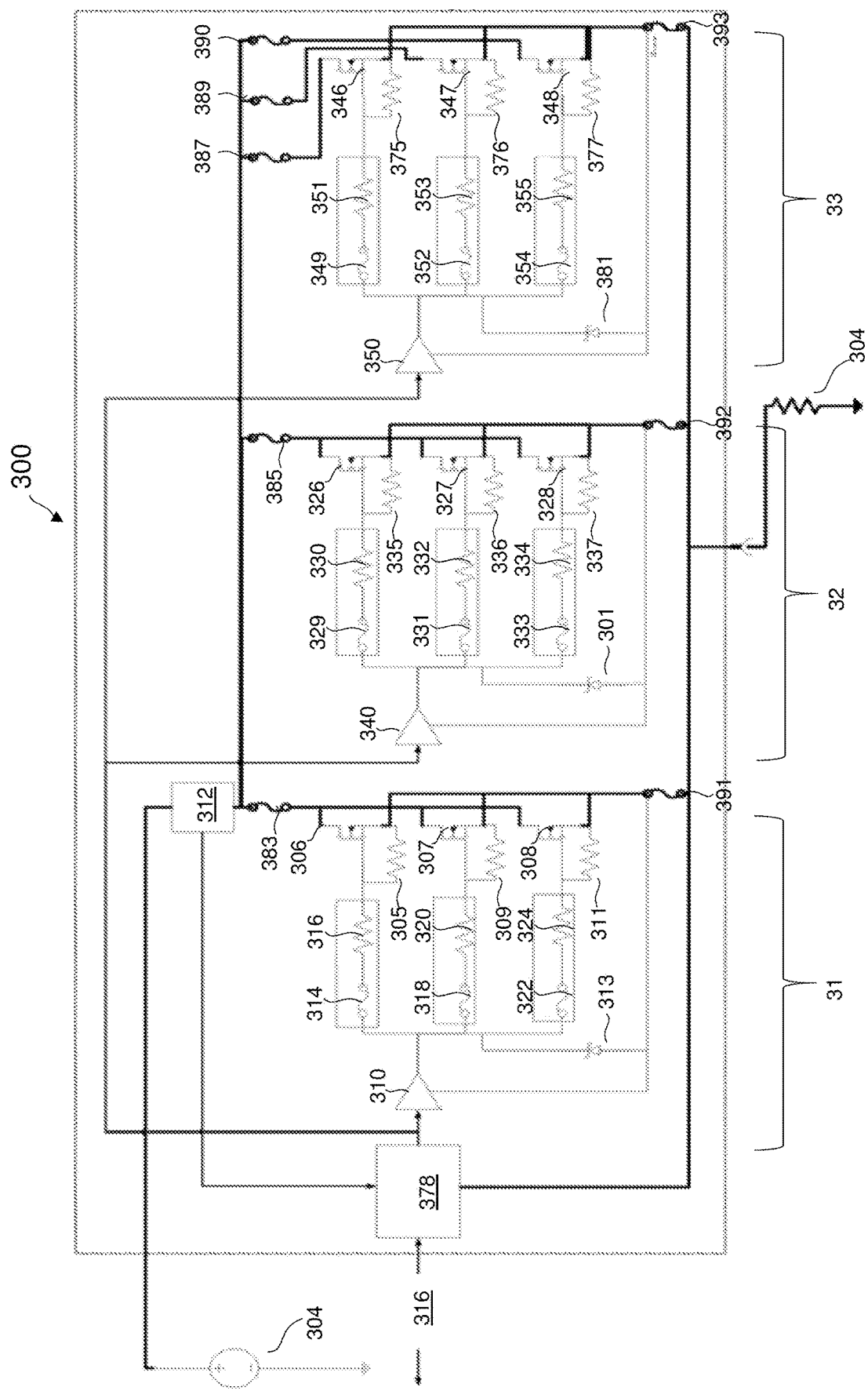
FIG. 3 illustrates an SSPC constructed in accordance with several aspects described herein.

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

In the following descriptions, it is assumed that a power switching element (e.g., a MOSFET, a JFET, a BJT, an IGBT, a triac, or a thyristor) may undergo a short circuit or an open circuit failure between its terminals. Nevertheless, other failures modes are also contemplated; namely, failure modes wherein the switching element exhibits a change in conductance between in its terminals with respect to a predetermined threshold. One of skill in the art will readily recognize that, among other methods, such intermediate failure modes can be detected by monitoring current(s) and/or voltage(s) and comparing said current(s) and/or voltage(s) with threshold values.

FIG. 1 illustrates a conventional SSPC 100. In the conventional SSPC 100, the flow of power originates from a power source 102 to an external load 104; power delivery to the load 104 is controlled using a switching element, namely metal-oxide semiconductor field-effect transistor (MOSFET) 106. The conventional SSPC 100 includes a controller 108 that is configured to enable or inhibit the flow of power to the load 104 by changing the voltage applied to the gate of the MOSFET 106.

The controller 108 can be implemented using a microcontroller or an equivalent circuit block having suitable interfaces and computational functions. The conventional SSPC 100 includes a driver 100 disposed between the output of the controller 108 and the gate of the MOSFET 106. The driver 110 is typically an amplifier whose design and characteristics are optimized to provide an electrical interface between the controller 108 and the gate of the MOSFET 106.

The potential difference that controls the MOSFET 106 is between its gate and its source. Therefore, because the source of the MOSFET 106 is at the same potential as the load 104, the driver 110 is often referred to the to the power input line of the load 104. However, the controller 108 may be referred to a local ground (not shown) or to the power input line of the load 104 (as shown), providing adequate isolation or level shifting circuitry is included in the controller 108 to accommodate this flexibility. The conventional SSPC 100 can be communicatively coupled to remote devices or systems via a network communication interface 116, whose circuits (not shown) may be referred to the local ground, as opposed to the power input line of the load 104. Certain metrics (e.g., fault occurrences, current levels, power dissipation, and SSPC status) can be probed and communicated via the network communication interface 106.

The conventional SSPC 100 includes a current sensor 112 that provides the controller 108 real-time monitoring of the current flowing to the load 104 so that the controller 108 can detect an over-current situation and switch off the MOSFET 106, thereby protecting the current path to the load 104. The conventional SSPC 100 further includes a fuse 114 which serves as a back-up over-current protection device should the SSPC function fail. The precise position of the fuse 114 in the current path from the power source 102 to the load 104 may be varied without affecting its function.

The maximum current rating of the conventional SSPC 100 is limited by the MOSFET 106, which typically corresponds to an SSPC current rating of 5 A. To obtain a higher SSPC current rating, several MOSFETS can be placed in parallel, as shown in the conventional SSPC 200 of FIG. 2. Specifically, to service a load 204 that requires more power than the load 104 of FIG. 1, the conventional SSPC 200 can route three times more power from the power source 104 to the load 204 by using three MOSFETS (2061, 2062, and 2063). Each of the three MOSFETS has a gate resistor (namely, gate resistors 2071, 2072, and 2073) disposed at its gate.

The gate resistors' resistance, typically about 5 Ohms each, is chosen to be large enough to prevent oscillations and small enough to ensure that the MOSFETS can be efficiently switched by the controller 108 and the driver 110. As such, the conventional SSPC 200 provides a sustained current capability that is greater than that of the conventional SSPC 100. It is possible to obtain even higher current capacity SSPCs by parallelizing more switching elements. For example, a 500 A SSPC could be obtained by parallelizing 100 MOSFETS in a manner similar to that shown in FIG. 2.

While higher current carrying capacities can be obtained by increasing the number of switching elements in a parallel combination, SSPCs implemented in such fashion exhibit several issues. From a reliability standpoint, the greater the number of power switching elements included in an SSPC, the more likely the SSPC is to fail.

For example, if one of the switching elements in the parallel combination develops an internal fault, the resulting current flows may readily damage the other switching elements. Typically, the wide scale of such damages may cause secondary problems, including arcing, smoke, and/or fire, which can be very hazardous and distressing in some applications, such as during aircraft flight.

FIG. 3 illustrates an exemplary high current capacity SSPC 300, according to an embodiment. The SSPC 300 mitigates the above-mentioned issues as well as other issues known in the art, as shall be described below in greater detail.

The conventional SSPC 300 includes a current sensor 312 that provides the controller 378 real-time monitoring of the current flowing to the load 304 so that the controller 108 can detect an over-current situation. Further, the SSPC 300 includes nine switching elements (MOSFETs 306-308, 326-328, and 346-348) that are distributed by groups of three among sections 31, 32, and 33. Each section includes an over-voltage protection circuit (313, 301, and 381), which can be a Zener diode or a transient voltage suppressor. Generally, the over-voltage protection circuits 301, 313, and 381 can be implemented using a component that has clamping characteristics, such as a Zener diode or a transient voltage suppressor. Further, each group includes gate circuits disposed at each gate of the switching elements and that each comprises a fuse, a gate resistor, and a gate-to-source resistor.

Specifically, the switching elements in section 31 are interfaced with gate circuits that include fuses 314, 318, and 331, gate resistors 316, 320, and 324, and gate-to-source resistors 305, 309, and 311; those of section 32 are interfaced with gate circuits that include fuses 329, 331, and 333, gate resistors 330, 332, and 334, and gate-to-source resistors 335, 336, and 337; and those of section 33 are interfaced with gate circuits that include fuses 349, 352, and 354, gate resistors 351, 353, and 355, and gate-to-source resistors 375, 376, and 377. The SSPC 300 further includes a set of drivers (310, 340, and 350), each of which is dedicated to one of section 31, 32, and 33.

In the absence of a fault in either switching element, the nine switching elements form a parallel combination that can carry nine times the maximum current rating of a single switching element. Furthermore, the SSPC 300 includes several structural features, which, as will be described in greater detail below, confers several advantageous aspects; each feature may be used on its own or in combination with the others, depending on the degree of benefit required.

One feature includes a set of fuses (383, 385, 387, 389, 390, 391, 392, and 393) that may be used to isolate specific parts of the SSPC 300 based on the location of a fault. The current rating of each fuse is chosen to provide both a reliable connection in fault-free circumstances and the required protection in the event of a fault. It should be understood that each fuse may be a specific component dedicated for such purpose, or any fusible component or connection that provides an equivalent function.

Moreover, a fuse rating refers herein to the maximum current the fuse can carry, irrespective of a time limit. Nevertheless, each fuse can carry a current greater than its rating for a short transient period but will blow when subjected to a sustained current substantially in excess of its rating. By example, and not by limitation, each fuse of the set of fuses (383, 385, 387,389, 390, 391, 392, and 393) can have a current rating of about 5 A.

Each of the fuses 383 and 385 will isolate the group of three switching elements directly connected to it in the event of excessive flow into that group. Such excessive current flow could be due to faults like a short circuit to ground on the circuit board housing the SSPC 300 or because one or more of the switching elements in that group has failed to open when commanded to do so by the controller 378, such that the entire current flow through the SSPC 300 is confined to that group.

In such situations, either one of fuses 383 and 385 must be specified to reliably carry its fair share of the SSPC 300 total's rating (i.e., about ⅓ of the total current rating). Nevertheless, either one of the fuses 383 and 385 will blow if the current approaches the normal maximum current flow through the SSPC 300. Thus, considering when the SSPC 300 is commanded to turn off while being connected to the load 304, in the event of such faults, either one of the fuses 383 and 385 is likely to blow and isolate a group that has a switching element experiencing a short circuit (e.g., a MOSFET experience a drain-to-source short circuit).

Moreover, in some embodiments, each of the fuses 383 and 385 can be replaced by a set of fuses like the fuses 387,389, and 390 to provide additional granularity in the protection architecture of the SSPC 300. Specifically, the fuses 387, 389, and 390 perform the same function as the fuses 383 or 385, but each can isolate a single switching element that experiences a fault. In some embodiments, the rating of each of the fuses 387, 389 and 390 will be a suitable fraction (e.g., ⅓$^{rd}$ as shown) of the single fuse it substitutes (e.g., fuse 385).

The fuses 391, 392, and 393 are configured to isolate their respective power switching element block (i.e., sections 31, 32, and 33) from the load 304. This isolation capability enables other blocks to continue functioning when one block develops a short circuit to ground. The likelihood of such a short circuit depends on the specific physical implementation of the SSPC 300, and hence, the inclusion of fuses 391, 392, and 393 is optional. Lastly, in regards to the SSPC 300, as an alternate configuration (not shown), either one of fuses 391, 392, and 393, could be configured as a set of fuses (like fuses 387, 389, and 390), in order to isolate a specific switching element in which a fault occurs.

Another advantageous feature of the SSPC 300 is provided by the fuses and gate resistors interfaced at the gates of the switching elements. Each of sections 31, 32, and 33 must be protected against excessive gate-to-source voltages that may developed at the output of the drivers 310, 340, or 350. As such the fuses in the gate circuits (e.g., fuses 314, 318, and 322) serve to safely limit the transient power flow between a faulty gate (which is attempting to pass an excessive current) and the remainder of the gate drive circuitry in that section, including the driver (e.g., 310), the voltage protection device (e.g., 313) and the gates of other FETs in the same section (e.g., 307 and 308, if 306 was the faulty device). The fuses 314, 318, and 322 are chosen to be capable of absorbing transient energy caused by foreseeable faults such as one of the MOSFETs developing a drain-to-gate short. Furthermore, together with their respective gate resistors, the fuses can serve to limit the time and maximum current that a MOSFET switching element is exposed to in the event of a drain-to-gate short.

Stated otherwise, a gate resistor limits the instantaneous fault current to a value that can be handled by the driver components (e.g., 310 and 313) for a short time without exceeding gate voltage for other FETs sharing the same driver (e.g., 307 & 378). Moreover, the fuse blows if an abnormal current continues to flow before the driver components overheat.

As such, the drivers 310, 314, and 350 are specified to ensure that their corresponding gate circuits are sufficiently robust and capable of achieving the over-voltage protection needed without including additional components. In alternate configurations (not shown) the gate circuit can be configured to protect both the drivers as well as the switching elements. In a not shown alternative embodiment, the voltage protection device 313 may be omitted if the driver 310 is sufficiently robust.

The first function of the gate resistors is to prevent oscillation at the gates of the MOSFETS, as previously described with respect to the conventional SSPC 200. However, in the SSPC 300, in the event of an internal MOSFET fault, such as a drain-to-gate short, the gate resistors also limit the excessive current flow that the gate circuit may absorb. Hence, yet another advantageous feature of the SSPC 300 is the secondary role afforded by the gate resistors.

If a MOSFET develops a gate fault (such as a drain-to-gate short) that causes a substantial gate current to flow, then initially, the gate circuit, combined with the driver, ensures that the voltage applied to the MOSFET's gate remains within a predetermined allowable range. However, this fault current can cause rapid heating within certain components of the driver and/or of the gate circuit. Thus, the fuse included in the gate circuit provides a means for withstanding normal gate current transients and for discontinuing current flow in a timely manner when a sustained current flow is established, thereby isolating the faulty MOSFET gate and protecting the remainder of the SSPC 300 from substantial damage.

In addition, it is noted that the while the gate resistor and fuse are shown in a rectangular box to indicate that the total functionality may be implemented with two separate components, in some embodiments, it is possible to select a resistor that will fail and yield a high impedance or open circuit when subjected to a sustained excessive current flow. Therefore, it in these embodiments, the fuse is not needed.

The gate-to-source resistors of the gate circuit ensure that a given MOSFET is turned off in the absence of a gate drive signal, such as when the fuse in the gate circuit is blown. The gate-to-source resistor can be a large resistor (e.g., ~1 M Ohm) to avoid unnecessarily loading the gate drive circuit.

It is noted that connecting the gate-to-source resistors as shown in FIG. 3 is appropriate for enhancement MOSFETs that are non-conductive when their gate-to-source potential is zero. For other types MOSFETs, the gate-to-source resistor can be connected to the MOSFET's source at one end and to a bias voltage source at another end.

The SSPC 300 is configured for unidirectional current supply to the load 304 via the switching elements. However, if the polarity across the drain-to-source terminals of the MOSFETs changes, as would be the case if the source 304 was an AC source, then the MOSFET would be unable to block the current because it includes an intrinsic diode that becomes reverse-biased as a result of the change in polarity of the source.

Figure 4:
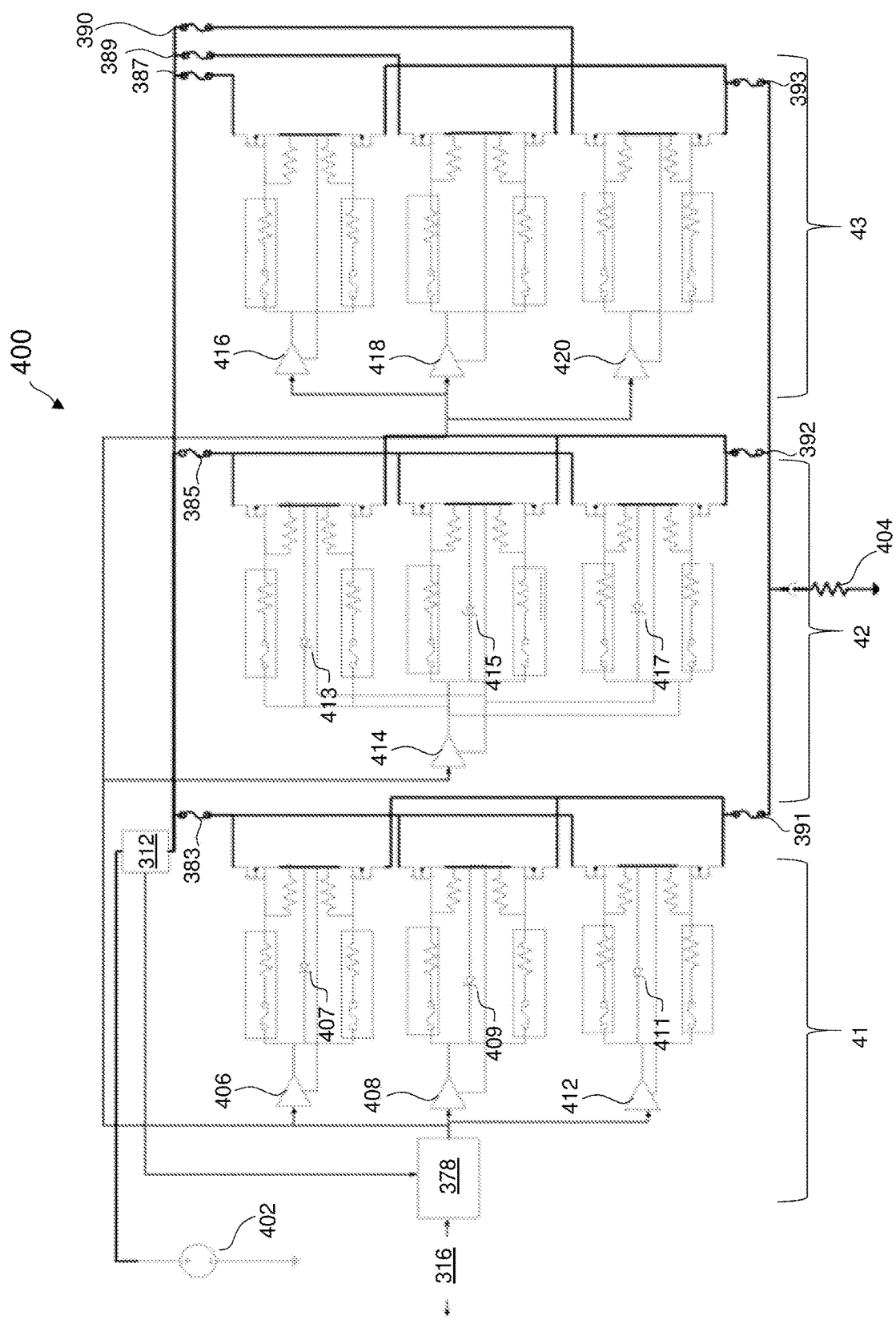
FIG. 4 illustrates an SSPC in accordance with several aspects described herein.

FIG. 4 illustrates an exemplary SSPC 400 configured according to an embodiment that is adapted to support bi-directional current flow. The SSPC 400 is configured for driving a load 404 with an AC source 402, which, as a result of alternating polarity, produces a bi-directional current flow to the load 404. The SSPC 400 includes eighteen (i.e., nine pairs of) back-to-back MOSFETS. It is noted that bi-directionality of current flow can also be achieved with a DC source by configuring the external wiring of the SSPC 400 accordingly, and that as such, the SSPC 400 is not limited to operation with an AC source.

The exemplary SSPC 400 of FIG. 4 includes nine pairs of back-to-back MOSFETs that act as if they were connected in parallel, provided there is not a fault condition. The SSPC 400 includes fuses and gate circuits that are similarly configured in the SSPC 300, and as such, the previous descriptions of these components are equally applicable to the SSPC 400. For ease of description, the SSPC 400 is shown to include MOSFETs that are connected in three groups of three pairs of MOSFETs per group, but the SSPC 400 can readily be scaled for larger numbers of groups and for larger numbers of MOSFET pairs per group.

The SSPC 400 includes a set of drivers (406, 408, 412, 414, 416, 418, and 420) that are distributed across sections 41, 42, and 43, each section being a power switching block configured to accommodate bi-directional current flow. Each of the drivers is referred to a source terminal of the respective back-to-back MOSFET pair it drives. As in the case of the SSPC 300, the SSPC 400 includes a variety of features which can be used alone or in various combinations to yield alternate implementations.

The sections 41 and 42 each have an explicit gate over-voltage protection circuit (407, 409, 411, 413, 415, and 417) associated with each MOSFET pair. These over-voltage protection circuits can be implemented using a component that has clamping characteristics, such as a Zener diode. In the section 43, these over-voltage protection circuits are omitted, in order to illustrate yet another exemplary implementation of a bi-directional power switching block. In such alternate embodiments, the gate drivers may be sufficiently robust for the application at hand, and thus may not require additional over-voltage protection circuits.

Moreover, in yet another variant, the section 43 illustrates a single driver (414) that is configured to drive all the MOSFET pair gates. In such exemplary embodiments of a bi-directional power-switching block, the impedance of the driver 414 guarantee that a fault one of the MOSFET pair is not capable of damaging or disrupting the control of the other MOSFET pairs.

The exemplary embodiments described herein provide fault-tolerant uni-directional or bi-directional SSPCs. Several structural features provide varying degrees of protection. Further, the exemplary embodiments provide highly parallel circuits in which the number of components subjected to excessive voltages and currents can be kept to a minimum. Furthermore, the exemplary embodiments allow the isolation of the faulty component(s), while allowing the remainder of the circuit to continue to function.

Those skilled in the relevant art(s) will appreciate that various adaptations and modifications of the embodiments described above can be configured without departing from the scope and spirit of the disclosure. Therefore, it is to be understood that, within the scope of the appended claims, the teachings set forth in the present disclosure may be practiced other than as specifically described herein. Specifically, the teachings presented herein are also applicable to SSPCs that can be used in applications other than aircraft systems.

The invention claimed is:

1. A solid state power controller for delivering power to a load, comprising:
   a set of sections, wherein each section comprises:
      at least one power switching block and wherein each power switching block includes a set of power switching elements, and
      a plurality of gate circuits, each gate circuit disposed at a gate of a corresponding power switching element, each gate circuit includes (i) a gate-to-source resistor and (ii) a first fuse and a gate resistor connected in series wherein the gate resistor and the gate-to-source resistor are both connected directly to the gate and wherein in each section, the first fuses of the gate circuits are connected together; and
   protection circuitry, wherein the protection circuitry is configured to prevent a fault occurring in one power switching block from propagating to the other sections, to other power switching blocks, or to the load wherein the protection circuitry includes the plurality of gate circuits and a second fuse, the second fuse being connected to sources of the set of power switching elements and configured to isolate the section and the at least one power switching block from the load and other sections, when a short circuit to ground occurs in the section.

2. The solid state power controller of claim 1, wherein the fault is a short circuit.

3. The solid state power controller of either of claim 1, wherein the fault is characterized as a current of the solid state power controller exceeding a predetermined threshold.

4. The solid state power controller of claim 3, wherein the current flows through at least one of the power switching blocks and the load.

5. The solid state power controller of claim 1, wherein a power switching element from the set of power switching elements is selected from the group consisting of a metal-oxide semiconductor field-effect transistor, a junction field effect transistor, a bipolar junction transistor, an insulated gate bipolar junction transistor, a triac, and a thyristor.

6. A solid state power controller for delivering power to a load, comprising:
   sets of power switching elements; and
   first, second, and third protection circuits and a plurality of gate circuits, each protection circuit comprises a gate circuit of the plurality of gate circuits, each gate circuit disposed at a gate of a corresponding power switching element, each gate circuit includes (i) a gate-to-source resistor and (ii) a first fuse and a gate resistor connected in series wherein the gate resistor and the gate-to-source resistor are both connected directly to the gate and wherein the first fuses of the gate circuits are connected together;

wherein the first protection circuit is configured to isolate a first fault occurring on a power line of a first set of power switching elements from reaching a second set of power switching elements, wherein the second protection circuit is configured to isolate a second fault occurring in the second set of power switching elements from reaching the first set of power switching elements and a third set of power switching elements, and wherein the first, second, and third protection circuits each further comprise a second fuse, each second fuse being connected to sources of a corresponding set of power switching elements and configured to isolate the corresponding set of power switching elements from the load and the other sets of power switching elements when a short circuit to ground occurs.

7. The solid state power controller of claim 6, wherein the third protection circuit is configured to isolate a third fault occurring in a power switching element included in the third set of power switching elements from reaching the first set of power switching elements and the second set of power switching elements.

8. The solid state power controller of claim 7, wherein the first, second, and third faults are each a short circuit.

9. The solid state power controller of either of claim 7, wherein the first, second, and third faults are each a current of the solid state power controller exceeding a predetermined threshold.

10. The solid state power controller of claim 9, wherein the current flows through at least one set of the sets of power switching elements, one of the second fuses, and the load when propagating through the solid state power controller.

11. The solid state power controller of claim 10, wherein the power switching elements are selected from the group consisting of a metal-oxide semiconductor field-effect transistor, a junction field effect transistor, a bipolar junction transistor, an insulated gate bipolar junction transistor, a triac, and a thyristor.

12. A solid state power controller for delivering power to a load, comprising:

a power switching block and wherein the power switching block includes a set of power switching elements; and protection circuitry comprising a gate circuit disposed at each gate of each power switching element, the gate circuit includes (i) a gate-to-source resistor and (ii) a first fuse and a gate resistor connected in series wherein the gate resistor and the gate-to-source resistor are both connected directly to the gate and the first fuses of the gate circuits are connected together and wherein the protection circuitry is configured to prevent a fault occurring in a power switching element of the set of power switching elements from propagating to other power switching elements of the set of power switching element, and wherein the protection circuitry further comprises a second fuse connected to sources of the set of power switching elements and configured to isolate the power switching block from the load and any other power switching blocks, when a short circuit to ground occurs in the power switching block.

13. The solid state power controller of claim 12, wherein the protection circuitry is further configured to prevent the fault from propagating to the load.

14. The solid state power controller of either of claim 12, further comprising other power switching blocks.

15. The solid state power controller of claim 14, wherein the protection circuitry is further configured to prevent the fault from propagating to the other power switching blocks.

16. The solid state power controller of claim 12, further comprising an overvoltage protection circuit configured to protect the set of power switching elements.

17. The solid state power controller of claim 16, further comprising a controller configured to drive the set of power switching elements.

* * * * *